United States Patent
Adam et al.

(10) Patent No.: US 11,051,432 B2
(45) Date of Patent: Jun. 29, 2021

(54) ELECTRONIC MODULE, IN PARTICULAR AN ELECTRONIC POWER MODULE FOR HYBRID VEHICLES OR ELECTRIC VEHICLES

(71) Applicant: Robert Bosch GmbH, Stuttgart (DE)

(72) Inventors: Boris Adam, Gaeufelden (DE);
Wolfram Kienle, Magstadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/335,559

(22) PCT Filed: Aug. 23, 2017

(86) PCT No.: PCT/EP2017/071211
§ 371 (c)(1),
(2) Date: Mar. 21, 2019

(87) PCT Pub. No.: WO2018/054638
PCT Pub. Date: Mar. 29, 2018

(65) Prior Publication Data
US 2020/0022279 A1    Jan. 16, 2020

(30) Foreign Application Priority Data

Sep. 22, 2016   (DE) ...................... 10 2016 218 207.2

(51) Int. Cl.
*H05K 7/20* (2006.01)
*H05K 1/18* (2006.01)
*H01L 25/00* (2006.01)

(52) U.S. Cl.
CPC ............ *H05K 7/209* (2013.01); *H05K 1/184* (2013.01); *H05K 7/20445* (2013.01); *H01L 25/00* (2013.01); *H05K 7/20854* (2013.01)

(58) Field of Classification Search
CPC .. H05K 7/00; H05K 7/005–08; H05K 7/1422; H05K 7/20; H05K 7/209;
(Continued)

(56) References Cited

U.S. PATENT DOCUMENTS 6,297,981 B1 * 10/2001 Berberich ............. H02M 7/003
                                                            363/144
6,373,705 B1 *  4/2002 Koelle .................. H01L 23/645
                                                            361/720

(Continued)

FOREIGN PATENT DOCUMENTS

CN          2404300 Y    11/2000
CN          1336095 A     2/2002

(Continued)

OTHER PUBLICATIONS

Ackva, Ansgar, Connecting Device for Power Leads Subjected to Thermal Stresses, Particularly for Rectifiers or Similar, Aug. 2004 (Year: 2004).*

(Continued)

*Primary Examiner* — Zachary Pape
*Assistant Examiner* — Amir A Jalali
(74) *Attorney, Agent, or Firm* — Michael Best & Friedrich LLP (57) ABSTRACT

The invention relates to an electronic module (1), in particular an electronic power module for hybrid vehicles or electric vehicles, comprising: a printed circuit board (10) with at least one contact point (11); an electronic unit (20), in particular a power electronic unit, with at least one connection point (21), the connection point (21) of the electronic unit (20) being electrically connected to the contact point (11) of the printed circuit board (10) by means of at least one electrically conductive contact element (30); and a heat sink (40) with a top (41), the electronic unit (20)

(Continued)

bearing indirectly and/or directly against the top (41) of the heat sink (40). According to the invention, at least one heat-conducting element (50) is arranged between the contact element (30) and the heat sink (40) in such a manner that a thermally conductive connection is produced between the contact element (30) and the heat sink (40).

22 Claims, 4 Drawing Sheets (58) Field of Classification Search
CPC ....... H05K 7/2089–20945; H05K 1/00; H05K 1/184; H05K 3/00; H05K 5/0026; G06F 1/20; H02G 3/00
USPC .............. 361/709, 679.46–679.54, 704–712; 363/141–144; 165/80.1–80.5, 104.33, 165/185; 174/16.1–16.3; 257/712–722
See application file for complete search history.

(56) References Cited

U.S. PATENT DOCUMENTS

| | | | |
|---|---|---|---|
| 8,076,696 B2* | 12/2011 | Beaupre | H01L 24/49 257/177 |
| 9,107,318 B2* | 8/2015 | Hida | H05K 7/20927 |
| 9,379,083 B2* | 6/2016 | Iizuka | H01L 25/072 |
| 9,379,634 B2* | 6/2016 | Okumura | H05K 7/02 |
| 9,847,348 B1* | 12/2017 | Abesingha | H01L 23/535 |
| 2001/0034144 A1* | 10/2001 | Chemin | B60R 16/0239 439/76.2 |
| 2011/0307102 A1* | 12/2011 | Czamara | G06F 1/20 700/277 |
| 2012/0241953 A1* | 9/2012 | Yamada | H01L 25/18 257/737 |
| 2013/0088128 A1 | 3/2013 | Nakano et al. | |
| 2013/0214929 A1 | 8/2013 | Holma et al. | |
| 2013/0286602 A1* | 10/2013 | Chang | H05K 7/026 361/736 |
| 2014/0002995 A1* | 1/2014 | Pal | H01H 1/62 361/712 |
| 2014/0104790 A1 | 4/2014 | Yoon et al. | |
| 2014/0225482 A1* | 8/2014 | Hara | H02K 9/22 310/68 D |
| 2015/0077942 A1* | 3/2015 | Roche | H01L 23/053 361/708 |
| 2016/0027716 A1* | 1/2016 | Yamada | H01L 23/49838 257/712 |
| 2016/0249465 A1 | 8/2016 | Schmidt et al. | |
| 2019/0269031 A1* | 8/2019 | Ishibashi | H05K 7/2089 |
| 2020/0120789 A1* | 4/2020 | Ishikawa | B60L 3/003 |

FOREIGN PATENT DOCUMENTS

| | | |
|---|---|---|
| CN | 1953642 A | 4/2007 |
| CN | 102213208 A | 10/2011 |
| CN | 104470209 A | 3/2015 |
| EP | 0907310 | 4/1999 |
| EP | 0907310 A2 * | 4/1999 |

OTHER PUBLICATIONS

International Search Report for Application No. PCT/EP2017/071211 dated Nov. 6, 2017 (English Translation, 2 pages).

* cited by examiner

ELECTRONIC MODULE, IN PARTICULAR AN ELECTRONIC POWER MODULE FOR HYBRID VEHICLES OR ELECTRIC VEHICLES

BACKGROUND OF THE INVENTION

The invention relates to an electronic module, in particular an electronic power module for hybrid vehicles or electric vehicles.

Inverter configurations and converter configurations having commutating circuits comprising intermediate circuit capacitors and half bridges that are configured by way of example in power modules are used in hybrid vehicles or electric vehicles. By way of example, inverters that provide the phase currents for the electrical machine are used for operating an electric machine.

The power modules are controlled in this case via a circuit board that is in electrically conductive contact with the power modules by means of contacting elements, such as by way of example press-in pins. In so doing, the power modules are arranged between the circuit board and a cooling body and cooled down by means of the cooling body. Nowadays, the circuit board is thermally connected only in a low voltage region. A high voltage region of the circuit board that is separated from the low voltage region of the circuit board by means of a groove in the circuit board is not cooled or is only slightly cooled.

SUMMARY OF THE INVENTION

The invention proposes an electronic module, in particular an electronic power module, for hybrid vehicles or electric vehicles. The electronic module comprises a circuit board having at least one contacting site and furthermore comprises an electronic unit, in particular an electronic power unit, having at least one connection site, wherein the connection site of the electronic unit is connected in an electrically conductive manner to the contacting site on the circuit board by means of at least one electrically conductive contacting element. The electronic module comprises furthermore a cooling body having an upper face, wherein the electronic unit lies indirectly and/or directly against the upper face of the cooling body. In accordance with the invention, at least one heat-conducting element is arranged between the contacting element and the cooling body in such a manner that a heat-conducting connection is produced between the contacting element and the cooling body.

In contrast to the prior art, the electronic module in accordance with the invention has the advantage that the heat-conducting element that is arranged between the contacting element and the cooling body renders it possible to dissipate heat from the contacting element via the heat-conducting element to the cooling body and consequently it is possible to produce a continuous heat-conducting connection between the circuit board and the cooling body. This heat-conducting connection between the circuit board and the cooling body renders it advantageously possible to discharge heat from the circuit board to the cooling body via the contacting element and the heat-conducting element and consequently it is advantageously possible to cool the circuit board by means of the cooling body and thus to reduce the thermal loading on said circuit board. Consequently, it is advantageously possible to cool the circuit board by means of the cooling body.

The electronic module in accordance with the invention also renders it possible by way of example to cool a high voltage region of the circuit board, which is separated by way of example by means of a groove from a low voltage region of the circuit board, by way of example via the contacting sites of the circuit board in the high voltage region of the circuit board.

In one particularly advantageous exemplary embodiment, the heat-conducting element comprises at least one inner recess, wherein the contacting element is arranged at least in part in the inner recess. By virtue of arranging the contacting element in the inner recess, it is advantageously possible to produce a particularly efficient heat-conducting contact between the contacting element and the heat-conducting element.

If the contacting element is pressed into the heat-conducting element, by way of example into the inner recess of the heat-conducting element, this produces the advantage that a particularly efficient heat-conducting contact is produced between the contacting element and the heat-conducting element and the contacting element may be connected to the heat-conducting element in a particularly efficient, fixed and stable manner.

The contacting element is advantageously configured in a pin-shaped manner with a first end and a second end, wherein the first end is connected in an electrically conductive manner to the contacting site of the circuit board and the second end of the contacting element is connected in an electrically conductive manner to the connection site of the electronic unit. The pin-shaped contacting elements render it possible to connect the contacting sites of the circuit board in an advantageously simple and stable manner to the connection sites of the electronic unit in an electrically conductive and simultaneously heat-conducting manner.

In one advantageous exemplary embodiment, an insulating layer is arranged between the upper face of the cooling body and the heat-conducting element, said insulating layer electrically insulating the heat-conducting element from the cooling body, wherein the heat-conducting element lies against the upper face of the cooling body indirectly via the insulating layer. An insulating layer of this type electrically insulates the heat-conducting element from the cooling body. Consequently, the heat-conducting element may also be configured by way of example in an electrically conductive manner and be in electrically conductive contact with the contacting element without as a result the contacting element being connected in an electrically conductive manner to the cooling body. It is simultaneously possible by virtue of the fact that the heat-conducting element lies indirectly against the upper face of the cooling body to produce an advantageously efficient heat-conducting contact between the heat-conducting element and the cooling body.

It is particularly advantageous that the insulating layer extends on the upper face of the cooling body in such a manner that said insulating layer is arranged in part between the upper face of the cooling body and the electronic unit and electrically insulates the cooling body from the electronic unit. An insulating layer of this type may electrically insulate the electronic unit from the cooling body and advantageously simultaneously also electrically insulate the heat-conducting element from the cooling body. Simultaneously, an insulating layer of this type may be advantageously produced in a simple manner by way of example from a one-piece film.

If the heat-conducting element adheres in a bonded-manner to the insulating layer, it is thus possible to produce a particularly efficient heat-conducting contact between the heat-conducting element and the insulating layer that connects the cooling body to the heat-conducting element. It is also possible in this manner for the heat-conducting element to be in particularly effective heat-conducting contact with the cooling body.

In a particularly advantageous exemplary embodiment, the connection site of the electronic unit is configured at least in part as an inner recess in an electrically conductive connection element and the heat-conducting element is arranged at least in part in the recess of the electrically conductive connecting element. It is consequently advantageously possible to connect the heat-conducting element in a simple and effective manner to the connection site and advantageously for said heat-conducting element to be in efficient heat-conducting contact with the connection site.

It is particularly advantageous that the heat-conducting element is pressed into the recess of the connection element. A heat-conducting element that is pressed in in this manner may be in advantageously effective heat-conducting contact with the connection element and the connection site. Furthermore, a heat-conducting element of this type is advantageously attached to the electronic unit in a fixed and stable manner. In so doing, the electrically conductive connection element may be configured as a stamped grid.

BRIEF DESCRIPTION OF THE DRAWINGS

Exemplary embodiments of the invention are illustrated in the drawing and are further explained in the description below. In the drawing.

DETAILED DESCRIPTION

The electronic module in accordance with the invention may be used in numerous applications, by way of example as an inverter or a converter in the automotive industry. By way of example, the electronic control unit may be used as an inverter, which is also described as a power inverter, for the operation of an electric machine by way of example in hybrid or electric vehicles or as a converter for hybrid or electric vehicles.

Figure 1:
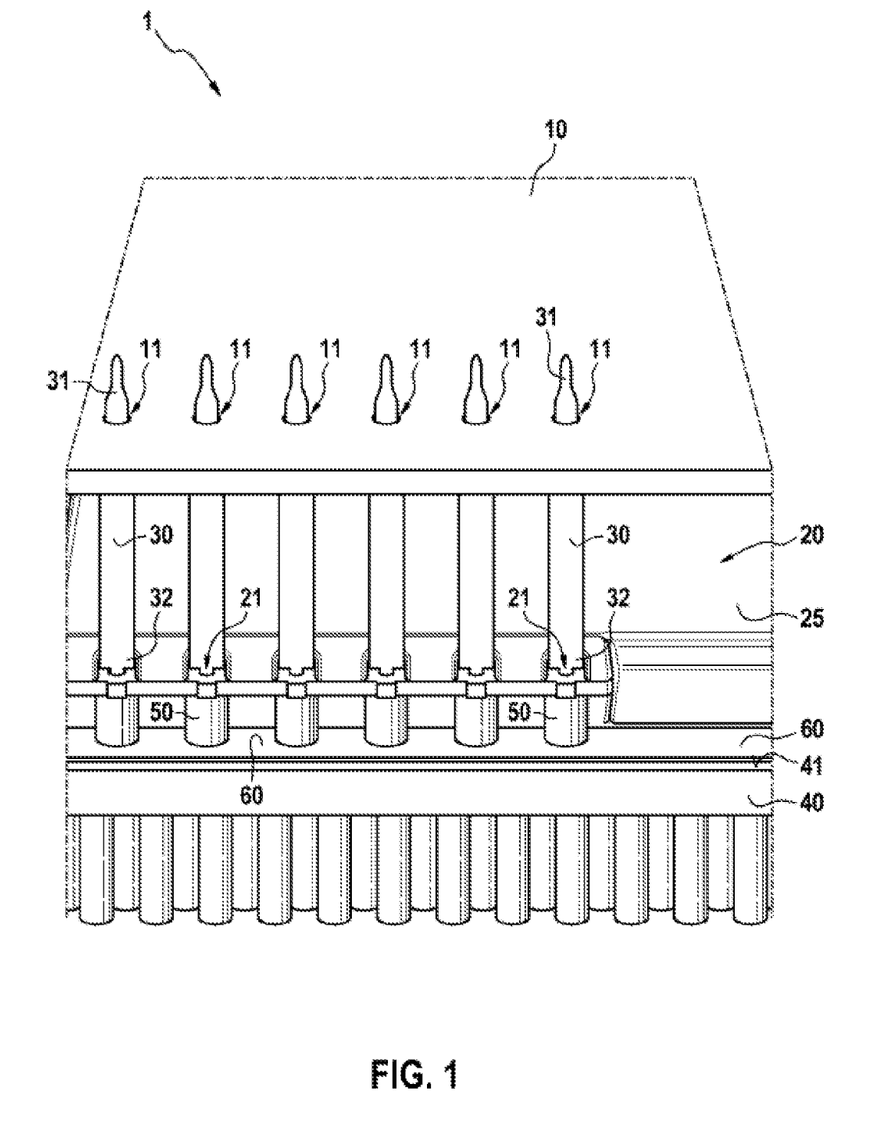
FIG. 1 illustrates a schematic view of an exemplary embodiment of the electronic module in accordance with the invention.

FIG. 1 illustrates a schematic view of an exemplary embodiment of the electronic module 1 in accordance with the invention. The electronic module 1 comprises an electronic unit 20, in this exemplary embodiment an electronic power unit. The electronic unit 20 comprises in the exemplary embodiment a plurality of connection sites 21 that are provided so as to produce an electrical contact with the electronic unit 20.

Figure 2:
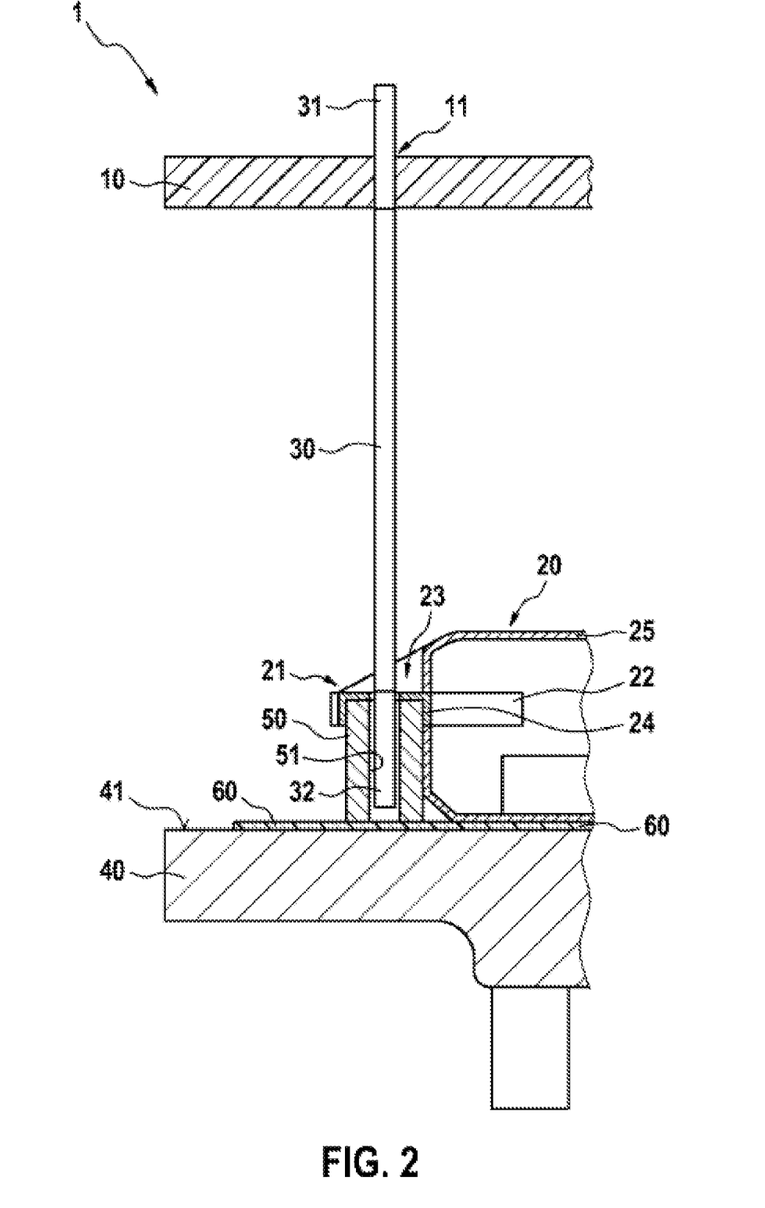
FIG. 2 illustrates a schematic cross section through the exemplary embodiment of the electronic module in accordance with the invention.
Figure 3:
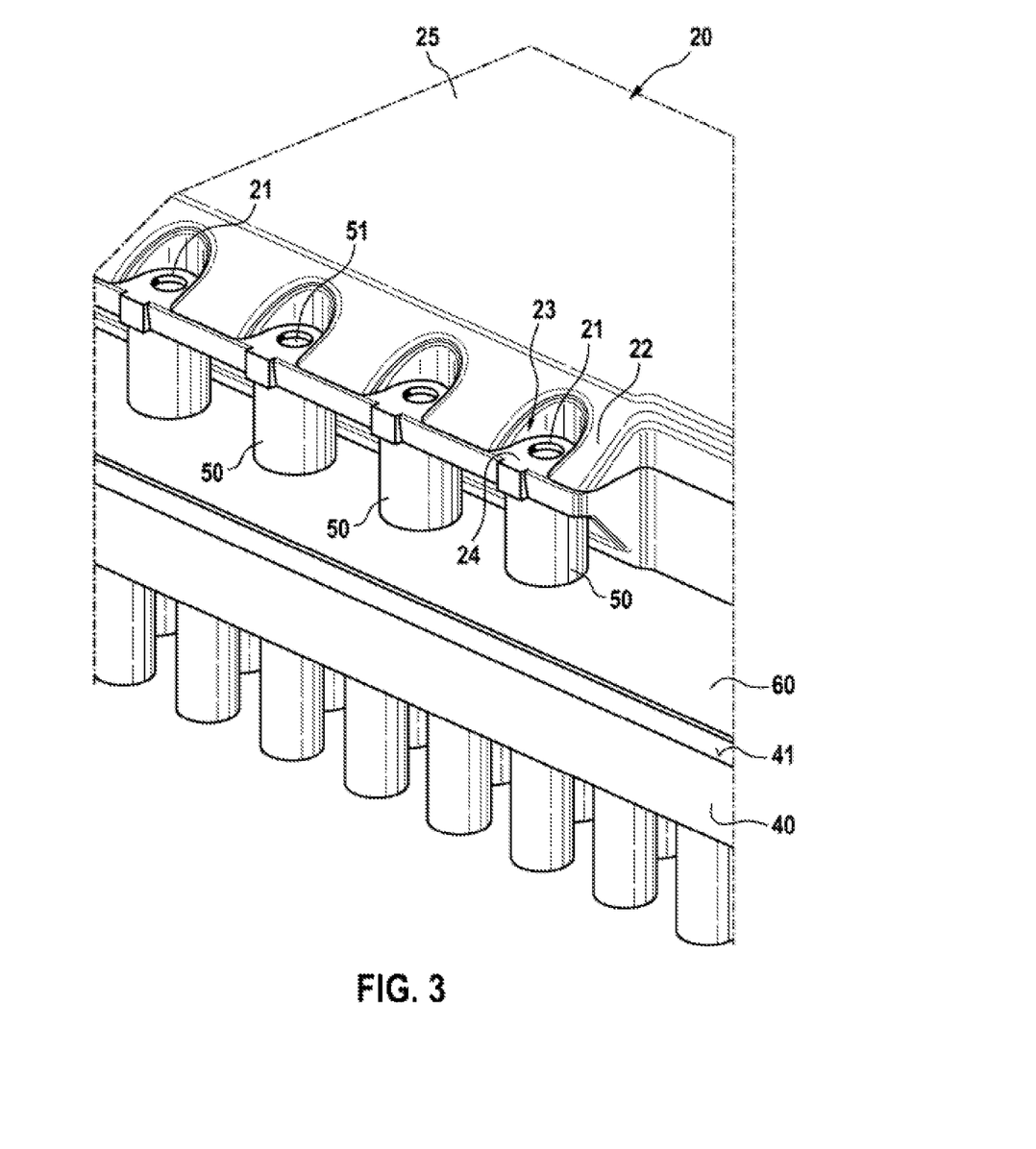
FIG. 3 illustrates a schematic view of the exemplary embodiment without the circuit board and the contacting elements.

The electronic unit 20 may be by way of example an electronic power unit. The electronic unit 20 is illustrated schematically in the figures with an electrically conductive connection element 22 at the connection sites 21 so as to produce an electrical contact with the electronic unit 20. The electronic unit 20 comprises in this exemplary embodiment a molded housing 25. By way of example, a carrier substrate, not illustrated in the figures, is arranged in the housing 25 and electrical and/or electronic components, not illustrated in the figures, are arranged on the carrier substrate. The carrier substrate may be by way of example a circuit carrier, in this exemplary embodiment a DBC substrate (direct bonded copper). The carrier substrate may however also be by way of example an AMB substrate (active metal brazed), an IMS (insulated metal substrate), a circuit board (PCB, printed circuit board) or any other substrate that is suitable for a power module. It is possible to arrange on the carrier substrate different electrical and/or electronic components, such as by way of example power semiconductors such as by way of example field effect transistors such as MIS-FETs (metal insulated semiconductor field effect transistor), IGBTs (insulated-gate bipolar transistor), power MOSFETs (metal oxide semiconductor field-effect transistor) and/or diodes, by way of example rectifier diodes. Furthermore, it is also possible to arrange on the carrier substrate passive components such as by way of example resistors or capacitors as electrical and/or electronic components. The carrier substrate may furthermore comprise conductor tracks, not illustrated in the figures. The conductor tracks of the carrier substrate may be configured as in this exemplary embodiment as conductive areas that are able to carry high currents. The electrical and/or electronic components may be connected to one another or to other electrical and/or electronic components, which are arranged outside the electronic unit 20 and are not illustrated in the figures, in an electrically conductive manner by way of example via the conductor tracks of the carrier substrate, via bonding wires or other suitable electrically conductive contacting elements by way of example by means of soldering or sintering processes. The electrical and/or electronic components may be connected to the connection sites 21 of the electronic unit 20 via the conductor tracks of the carrier substrate, via bonding wires or other suitable electrically conductive contact elements, such as by way of example the electrically conductive connection element 22 that is illustrated in the figures and is configured in this exemplary embodiment as a stamped grid. The connection sites 21 of the electronic unit 20 may be configured by way of example as an inner recess 23 in the electrically conductive connection elements 22, by way of example in a stamped grid.

The electronic component 1 comprises furthermore a cooling body 40 having an upper face 41, wherein the electronic unit 20 in this exemplary embodiment lies indirectly on the upper face 41 of the cooling body 40 by interpositioning an insulating layer 60. In so doing, the insulating layer 60 extends on the upper face 41 of the cooling body 40 in such a manner that said insulating layer is arranged between the upper face 41 of the cooling body and the electronic unit 20 and as a consequence the cooling body 40 is electrically insulated from the electronic unit 20. The insulating layer 60 electrically insulates the electronic unit 20 from the cooling body 40. The insulating layer 60 simultaneously produces a heat-conducting contact between the electronic unit 20 and the cooling body 40 with the result that heat that occurs in the electronic unit 20 is dissipated via the insulating layer 60 to the cooling body 40. However, it is also possible by way of example for the electronic unit 20 itself to be electrically insulated with respect to the outside and to lie against the upper face 41 of the cooling body 40 without interpositioning an insulating layer 60. The upper face 41 of the cooling body 40 is configured by way of example in a planar manner. The cooling body 40 is manufactured from a material that has effective heat conducting characteristics, such as by way of example aluminum or copper. The cooling body may be configured by way of example as a plate. It is possible by way of example as in this exemplary embodiment to provide on the cooling body 40 structures for improving the dissipation of heat, such structures being by way of example ribs, pins, or grooves.

Furthermore, the electronic module 1 comprises a circuit board 10. The circuit board 10 is arranged in this exemplary embodiment exactly as the electronic unit 20 and the insulating layer 60 on the upper face 41 of the cooling body 40. In so doing, the circuit board 10 in this exemplary embodiment is arranged in such a manner that the electronic unit 20 is arranged between the circuit board 10 and the cooling body 40. The circuit board 10 may be by way of example a rigid circuit board, by way of example a circuit board in a FR4 design or of a higher value, in other words by way of example a circuit board configured from a glass fiber-reinforced epoxy resin. However, the circuit board 3 may also be a HDI circuit board (high density interconnect circuit board), an LTCC (low temperature cofired ceramics) or any other suitable rigid or flexible circuit board. The circuit board 10 comprises by way of example one or multiple electrical and/or electronic components that together form by way of example a control circuit for the electronic unit 20, said electrical and/or electronic components are connected to one another by means of the conductor tracks that are not illustrated in the figures and said electrical and/or electronic components are likewise not illustrated in the figures. The circuit board 10 comprises in this exemplary embodiment a multiplicity of contacting sites 11 that are provided so as to connect in an electrically conductive manner the conductor tracks and electrical and/or electronic components of the circuit board 10, which in this exemplary embodiment form a control circuit, to components that are arranged outside the circuit board 10. The circuit board 10 is configured in this embodiment as a control circuit that is provided so as to control the electronic unit 20. For this purpose, the contacting sites 11 of the circuit board 10 are connected in an electrically conductive manner to the connection sites 21 of the electronic unit 20 by means of electrically conductive contacting elements 30.

In this exemplary embodiment, the contacting elements 30 are configured in a pin-shaped manner and each comprise a first end 31 and a second end 32. The respective first end 31 of a contacting element 30 is connected in an electrically conductive manner to a respective contacting site 11 of the circuit board 10. The respective second end 32 of a contacting element 30 is connected in an electrically conductive manner to a respective connection site 21 of the electronic unit 20. The contacting elements 30 may be by way of example signal pins and may be manufactured by way of example from an electrically conductive and thermally conductive material, by way of example from a metal, by way of example copper.

In order to produce a continuous heat-conducting contact between the circuit board 10 and the cooling body 40, heat-conducting elements 50 are arranged between the contact elements 30 and the cooling body 40. The heat-conducting elements 50 are arranged between the contacting elements 30 and the cooling body 40 in such a manner that a heat-conducting connection is produced between the contacting element 30 and the cooling body 40. A heat-conducting element 50 is in heat-conducting contact both with the cooling body 40 and also with the contacting element 30. The heat-conducting elements 50 may be configured by way of example as press-in sleeves as illustrated in this exemplary embodiment in the figures. The heat-conducting elements 50 are by way of example manufactured from a material that is highly heat conductive such as for example copper.

In this exemplary embodiment, the heat-conducting contact between the heat-conducting element 50 and the cooling body 40 is produced via an insulating layer 60 that is arranged between the cooling body 40 and the heat-conducting element 50. Thus, both the cooling body 40 and also the heat-conducting element 50 are in direct contact with the insulating layer 60. The insulating layer 60 is arranged between the upper face 41 of the cooling body 40 and the heat-conducting element 50 and electrically insulates the heat-conducting element 50 from the cooling body 40. In this case, the heat-conducting element 50 lies on the upper face 41 of the cooling body 40 indirectly via the insulating layer 60. In this exemplary embodiment, an insulating layer 60 electrically insulates both the heat-conducting elements 50 and also the electronic unit 20 from the cooling body 40. In this exemplary embodiment, the heat-conducting elements 50 adhere in a bonded manner to the insulating layer 60. The insulating layer 60 may be by way of example a lamination layer of synthetic material and consequently the heat-conducting elements 50 and/or the electronic unit 20 may be advantageously laminated on the upper face 41 of the cooling body 40.

The heat-conducting contact between the heat-conducting element 50 and the contacting element 30 is produced in this exemplary embodiment via a direct contact between the heat-conducting element 50 and the contacting element 30. Thus, in this exemplary embodiment, the heat-conducting element 50 comprises an inner recess 51 and the contacting element 30 is arranged in the inner recess 51 of the heat-conducting element 50. As in this starting example, it is particularly advantageous that the contacting element is pressed into the inner recess 51 of the heat-conducting element 50, which is configured by way of example as a press-in sleeve, pressed in and thus in particularly efficient heat-conducting contact with the heat-conducting element 50.

If the connection sites 21 of the electronic unit 20 are configured as in this exemplary embodiment as inner recesses 23 in an electrically conductive connection element 22, it is thus possible, as illustrated in FIG. 2 and FIG. 3, that the heat-conducting element 50, which may be configured by way of example as a cylindrical press-in sleeve, to be arranged at least in part in the inner recesses 23 of the electrically conductive connection elements 22. It is particularly advantageous that the heat-conducting element 50 may be pressed into the recess 23 of the electrically conductive connection elements 22. The electrically conductive connection element 22 may be configured by way of example as a stamped grid 24.

Figure 4:
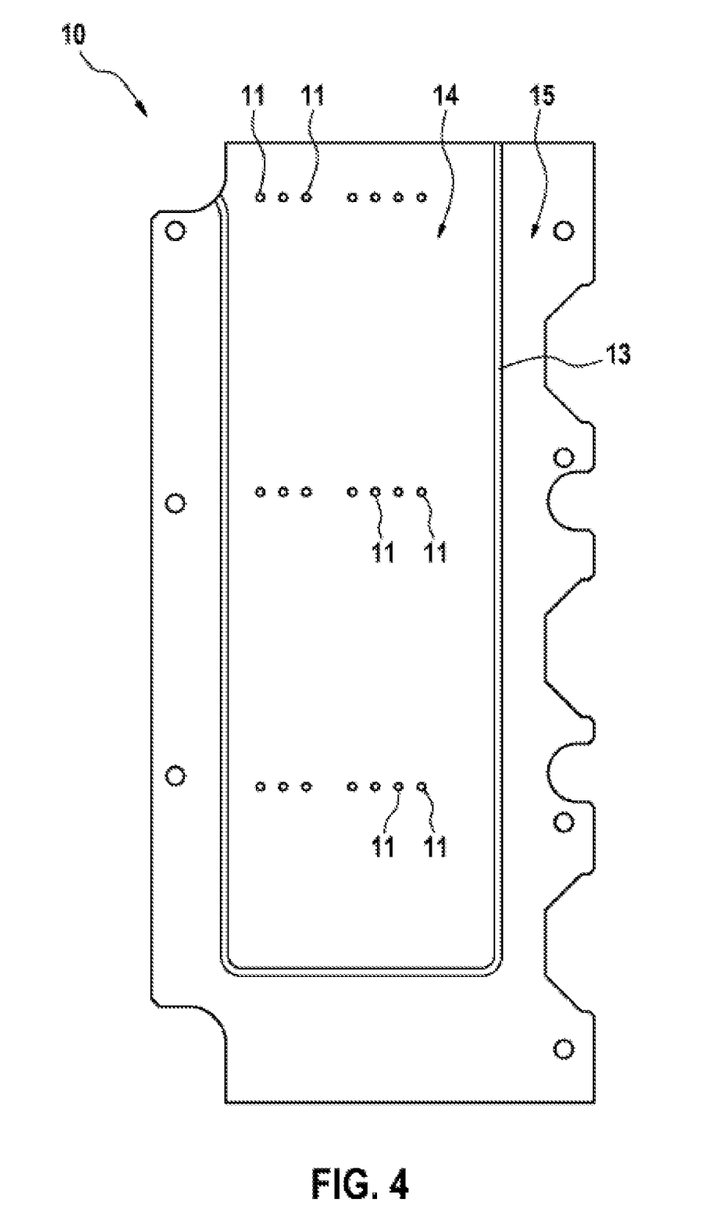
FIG. 4 illustrates a schematic view of an exemplary embodiment of a circuit board of the electronic module in accordance with the invention.

FIG. 4 illustrates a schematic view of an exemplary embodiment of the circuit board 10 of the electronic module 1 in accordance with the invention. In this exemplary embodiment, the circuit board 10 comprises two different regions, a high voltage region 14 and a low voltage region 15. The high voltage region 14 is separated by a separation groove 13 from the low voltage region 15 and consequently thermally insulated from the low voltage region 15. The contacting sites 11 are arranged in this exemplary embodiment of the circuit board 10 in the high voltage region 14 of the circuit board 10. Above all, extremely high temperatures arise in the high voltage region 14 of the circuit board 10 during the operation of the electronic module 1. The electronic module 1 in accordance with the invention renders it possible to dissipate the heat from the high voltage region 14 to the cooling body 40 via the contacting sites 11 of the circuit board 10, said contacting sites being arranged in the high voltage region 14, and via the contacting elements 30 that are connected to the contacting sites 11.

Naturally still further exemplary embodiments and combination of the illustrated exemplary embodiments are possible.

The invention claimed is:

1. An electronic module, said module comprising
a circuit board having a high voltage region, a low voltage region, and at least one contacting site in the high voltage region,
an electronic unit, having at least one connection site, wherein the connection site of the electronic unit is connected in an electrically conductive manner to the contacting site of the circuit board by at least one electrically conductive contacting element,
a cooling body having an upper face, wherein the electronic unit lies indirectly or directly on the upper face of the cooling body, and
at least one heat-conducting element between the contacting element and the cooling body in such a manner that a heat-conducting connection is produced between the contacting element and the cooling body, characterized in that the electronic unit includes an electrically conductive connection element, wherein the connection site of the electronic unit is configured at least in part as an inner recess in the electrically conductive connection element and wherein the heat-conducting element is arranged at least in part in the recess of the electrically conductive connection element,
characterized in that the heat-conducting element comprises at least one inner recess, wherein the contacting element is arranged at least in part in the inner recess of the heat-conducting element.

2. The electronic module as claimed in claim 1, characterized in that the contacting element is pressed into the heat-conducting element.

3. The electronic module as claimed in claim 1, characterized in that the contacting element is configured in a pin-shaped manner with a first end and a second end, wherein the first end is connected in an electrically conductive manner to the contacting site of the circuit board and the second end of the contacting element is connected in an electrically conductive manner to the connection site of the electronic unit.

4. The electronic module as claimed in claim 1, characterized in that an insulating layer is arranged between the upper face of the cooling body and the heat-conducting element, said insulating layer electrically insulating the heat-conducting element from the cooling body, wherein the heat-conducting element lies against the upper face of the cooling body indirectly via the insulating layer.

5. The electronic module as claimed in claim 4, characterized in that the insulating layer extends on the upper face of the cooling body in such a manner that said insulating layer is arranged in part between the upper face of the cooling body and the electronic unit and electrically insulates the cooling body from the electronic unit.

6. The electronic module as claimed in claim 4, characterized in that the heat-conducting element adheres in a bonded manner to the insulating layer.

7. The electronic module as claimed in claim 1, characterized in that the heat-conducting element is pressed into the recess of the electrically conductive connection element.

8. The electronic module as claimed in claim 1, characterized in that the electrically conductive connecting element is configured as a stamped grid.

9. The electronic module as claimed in claim 1, wherein the electronic module is an electronic power module configured for use in hybrid vehicles or electric vehicles.

10. The electronic module as claimed in claim 1, wherein the at least one heat-conducting element has an end portion that extends into the recess of the electrically conductive connection element, and wherein the at least one electrically conductive contacting element extends into the inner recess in the end portion of the at least one heat-conducting element.

11. The electronic module as claimed in claim 10, wherein the electrically conductive connection element has a region defining the recess of the electrically conductive connection element, and wherein the electrically conductive contacting element extends through an opening in the region defining the recess and into the inner recess in the end portion of the at least one heat-conducting element.

12. An electronic module, said electronic module comprising
a circuit board having at least one contacting site,
an electronic unit, having at least one connection site, wherein the connection site of the electronic unit is connected in an electrically conductive manner to the contacting site of the circuit board by at least one electrically conductive contacting element,
a cooling body having an upper face, wherein the electronic unit lies indirectly or directly on the upper face of the cooling body, and
at least one heat-conducting element between the contacting element and the cooling body in such a manner that a heat-conducting connection is produced between the contacting element and the cooling body,
wherein the electronic module is an inverter or a converter,
characterized in that the electronic unit includes an electrically conductive connection element, wherein the connection site of the electronic unit is configured at least in part as an inner recess in the electrically conductive connection element and wherein the heat-conducting element is arranged at least in part in the recess of the electrically conductive connection element,
characterized in that the heat-conducting element comprises at least one inner recess, wherein the contacting element is arranged at least in part in the inner recess of the heat-conducting element.

13. The electronic module as claimed in claim 12, characterized in that the contacting element is pressed into the heat-conducting element.

14. The electronic module as claimed in claim 12, characterized in that the contacting element is configured in a pin-shaped manner with a first end and a second end, wherein the first end is connected in an electrically conductive manner to the contacting site of the circuit board and the second end of the contacting element is connected in an electrically conductive manner to the connection site of the electronic unit.

15. The electronic module as claimed in claim 12, characterized in that an insulating layer is arranged between the upper face of the cooling body and the heat-conducting element, said insulating layer electrically insulating the heat-conducting element from the cooling body, wherein the heat-conducting element lies against the upper face of the cooling body indirectly via the insulating layer.

16. The electronic module as claimed in claim 15, characterized in that the insulating layer extends on the upper face of the cooling body in such a manner that said insulating layer is arranged in part between the upper face of the cooling body and the electronic unit and electrically insulates the cooling body from the electronic unit.

17. The electronic module as claimed in claim 15, characterized in that the heat-conducting element adheres in a bonded manner to the insulating layer.

18. The electronic module as claimed in claim 12, characterized in that the heat-conducting element is pressed into the recess of the electrically conductive connection element.

19. The electronic module as claimed in claim 12, characterized in that the electrically conductive connecting element is configured as a stamped grid.

20. The electronic module as claimed in claim 12, wherein the electronic module is an electronic power module configured for use in hybrid vehicles or electric vehicles.

21. The electronic module as claimed in claim 12, wherein the at least one heat-conducting element has an end portion that extends into the recess of the electrically conductive connection element, and wherein the at least one electrically conductive contacting element extends into the inner recess in the end portion of the at least one heat-conducting element.

22. The electronic module as claimed in claim 21, wherein the electrically conductive connection element has a region defining the recess of the electrically conductive connection element, and wherein the electrically conductive contacting element extends through an opening in the region defining the recess and into the inner recess in the end portion of the at least one heat-conducting element.

* * * * *